United States Patent [19]
Uesugi

[11] Patent Number: 5,278,799
[45] Date of Patent: Jan. 11, 1994

[54] SEMICONDUCTOR MEMORY CIRCUIT

[75] Inventor: Masaru Uesugi, Tokyo, Japan

[73] Assignee: Oki Electric Industry Co., Ltd., Tokyo, Japan

[21] Appl. No.: 702,329

[22] Filed: May 20, 1991

[30] Foreign Application Priority Data

May 25, 1990 [JP] Japan .................... 2-136223

[51] Int. Cl.$^5$ .............................................. G11C 7/00
[52] U.S. Cl. ........................ 365/230.01; 365/189.01; 365/222; 365/230.06
[58] Field of Search ............... 365/230.01, 189.01, 365/222, 230.06

[56] References Cited

U.S. PATENT DOCUMENTS

| | | | |
|---|---|---|---|
| 4,367,538 | 1/1983 | Shimada | 365/230.01 |
| 4,500,974 | 2/1985 | Nagami | 365/222 |
| 4,710,902 | 12/1987 | Pelley, III et al. | 365/222 |
| 4,800,525 | 1/1989 | Shah et al. | 365/230.01 |
| 4,982,370 | 1/1991 | Matsumoto et al. | 365/222 |
| 5,075,887 | 12/1991 | Magome et al. | 365/222 |

FOREIGN PATENT DOCUMENTS 60-206161 10/1985 Japan .
61-255591 11/1986 Japan .

Primary Examiner—William L. Sikes
Assistant Examiner—Scott A. Ouellette
Attorney, Agent, or Firm—Spencer, Frank & Schneider

[57] ABSTRACT

A semiconductor memory circuit in which data are stored in dynamic type memory cells located at crosspoints of bit and word lines, and are refreshed within a predetermined time by a sense amplifier so as to hold the thus stored data includes a first bit line connected to a first sense node of the sense amplifier. A second bit line is connected to a second sense node of the sense amplifier. A first switching circuit having a first terminal is disposed between the first bit line and the first sense node, for coupling the first bit line with the first sense node in response to a first control signal applied to the first terminal. A second switching circuit having a second terminal is disposed between the second bit line and the second sense node, for coupling the second bit line with the second sense node in response to a second control signal applied to the second terminal. A first control line is coupled to the first terminal and isolated from the second switching circuit and the second bit line, for providing the first control signal. A second control line is coupled to the second terminal and isolated from the first switching circuit and the first bit line, for providing the second control signal.

18 Claims, 2 Drawing Sheets

SEMICONDUCTOR MEMORY CIRCUIT

REFERENCE TO RELATED APPLICATIONS

This application claims a priority right under 35 U.S.C. 119, of Japanese Patent Application Serial No. 02-136223, filed on May 25, 1990, the entire disclosure of which is incorporated herein by reference.

BACKGROUND OF THE INVENTION

1. Field of the Invention

The present invention relates to a semiconductor memory circuit, and in particular, to a sense amplifier circuit system used for dynamic RAM (random access memory).

2. Description of the related Art

For example, dynamic RAM has been used as a semiconductor memory circuit which stores digital information in memory, and which reads and transmits this digital information therefrom to an external apparatus as necessary. This dynamic RAM is a semiconductor device having a plurality of memory cells into which data is stored. Each of the memory cells is composed of a transistor and a memory capacitor, and indicates "0" or "1", depending upon whether a charge is present in the memory capacitor or not. Further, this transistor is connected with bit lines (data lines) and word lines through which information is read or written. That is, when data stored in a memory cell is read out, the word lines are applied with a high voltage so as to turn on the transistor in order to detect a charge in a memory capacitor through a bit line. Further, in the case of writing, the memory capacitor is charged through the bit line. With such a dynamic cell type memory device, the charge in the memory capacitor can be held by setting the word line to a low voltage so as to turn off the transistor. However, since this charge is gradually reduced due to a slight leakage of current. Accordingly, the dynamic RAM is subjected to a refresh (rewriting) at intervals of a predetermined time in order to replenish the reduced charge. In the dynamic RAM, since a charge to be detected is small, there is used a peculiar amplifier circuit which is so-called sense amplifier and which can read with a high sensitivity and a high speed, and can be refreshed. This amplifier is connected with, for example, a pair of bit lines which are connected with memory cells, respectively.

Meanwhile, in these years, the degree of circuit integration has been rapidly enhanced due to the progress of fine work technology so as to attain a high capacity and a high performance. However, this involves various kinds of problems. For example, the attainment of high density due to large-scale circuit integration causes small pitches of bit lines, resulting in increase in coupling capacity between a pair of bit lines themselves and between adjacent bit lines. Accordingly, when an information is read out through a bit line from a memory cell, the memory cell to be sensed and amplified is directly influenced by a swing of an adjacent bit line. When the information stored in the memory cell is inverted due to the influence by the adjacent bit line, the transmission of the information cannot be precisely made, causing erroneous operation in a system using a dynamic RAM. For example, Japanese Laid-Open Patent No. 61-255591 discloses a conventional technology in which the potential between the adjacent bit lines are fixed to reduce the influence of the capacity between the adjacent bit lines, thereby eliminating the above-mentioned problem. However, in such a conventional technology, the reading/rewriting should be carried out through a pair of bit lines connected to the sense amplifier even though only one memory cell is read. Accordingly, a bit line which is not used for writing swings and extra current for charging and discharging runs therethrough. Thus, there has been such a problem that not only the consumption current is increased but also the amplifying operation of the sense amplifier is retarded.

BRIEF SUMMARY OF THE INVENTION

It is a general object of the present invention to provide a semiconductor memory circuit which can eliminate a detrimental influence caused by a coupling capacity of sensing and amplifying operation between the adjacent bit lines with the use of a technique other than conventional one while eliminating such a disadvantage that extra current runs, and which has a high degree of reliability and a low consumption current characteristic while having a high operating speed.

To the end according to the present invention, there is provided a semiconductor memory circuit in which data are stored in a plurality of dynamic type memory cells located at cross-points of bit lines, and the memory cells are refreshed within a predetermined time by a sense amplifier so as to hold the thus stored data; comprising: a first bit line connected to a first sense node of the sense amplifier; a second bit line connected to a second sense node of the sense amplifier; a first switch means disposed between the first bit line and the first sense node, and adapted to respond to a first control signal so as to selectively energize said first bit line and said first sense node; and a second switch means disposed between the second bit line and the second sense node and adapted to respond to a second control signal so as to selectively energize the second bit line and the second sense node.

According to one aspect of the present invention, control is made in such a way that when the first bit line is not selected upon rewriting, the first switch means is not communicated with its associated sense node while when the second bit line is not selected, the second switch means being not communicated with its associated sense node.

Further, according to the other aspect of the present invention, the first and second memory means each of which is a MOS transistor having n channels.

Further, according to the other aspect of the present invention, the sense amplifier has first and second transistors each of which is a MOS transistor having n channels, and third and fourth transistors each of which is a MOS transistor having p channels; and drains of the first and third transistors are connected to the first sense node, and drains of the second and fourth transistors are connected to the second sense node.

Further, according to the other aspect of the present invention, there is provided a semiconductor circuit apparatus in which data are stored in a plurality of dynamic type memory cells located at cross points of bit and word lines, and the memory cells are refreshed by a sense amplifier within a predetermined time so as to hold the data stored in the memory cells, comprising: a first bit line connected to a first sense node of the sense amplifier; a second bit line connected to a second sense node of the sense amplifier; a bit line voltage source for precharging the first and second bit lines up to a predetermined voltage; a third switch means disposed between the first and the bit line voltage source, and adapted to respond to a third control signal so as to selectively energize the bit line and the line voltage source; and a fourth switch means disposed between the second bit line and the line voltage source, and adapted to respond to a fourth control signal so as to selectively energize the second bit line and the bit line voltage source.

Further scope of the present invention will become apparent from the following detailed description and specific examples while used preferred embodiments are given by way of illustration purpose only, since various changes and modifications within the spirit and scope of the present invention will become apparent to those skilled in the art from this detailed description.

BRIEF DESCRIPTION OF THE SEVERAL VIEWS OF DRAWINGS

These and other features and advantages of the present invention may be more completely understood from the following detailed description of the preferred embodiments of the invention with reference to the accompanying drawings in which.

DETAILED DESCRIPTION OF PREFERRED EMBODIMENTS

Explanation will be made in detail of an embodiment of the semiconductor memory circuit according to the present invention with reference to the accompanying drawings.

Figure 1:
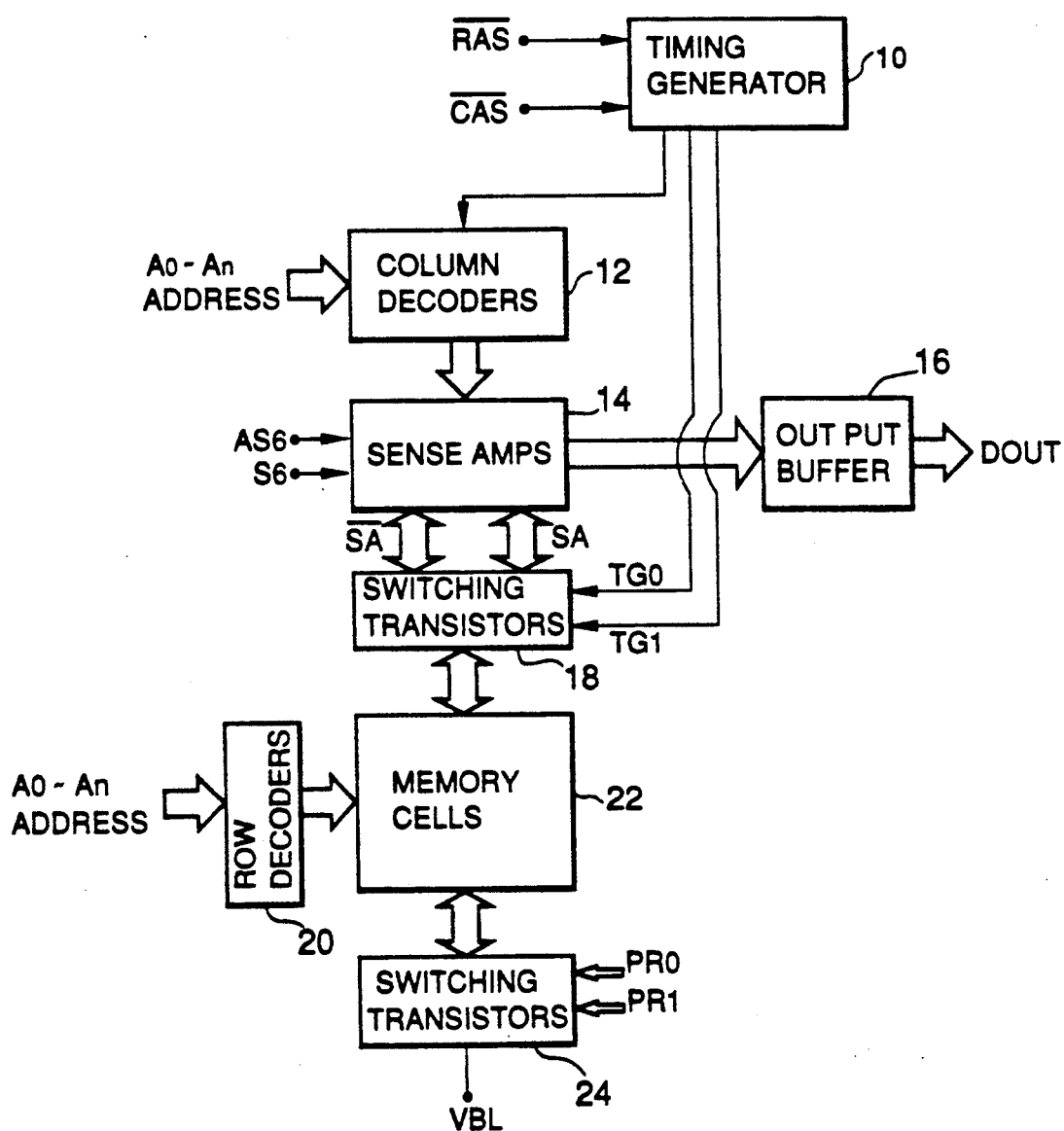
FIG. 1 is a functional block diagram illustrating an embodiment in which a semiconductor memory circuit according to the present invention is applied to dynamic RAM.

Referring to FIG. 1 which is a functional block diagram indicating an embodiment in which the semiconductor memory circuit is applied to dynamic RAM. The dynamic RAM is a semiconductor memory circuit which takes thereinto a row address at a row address strobing (RAS), and takes thereinto a column address at a column address strobing (CAS) for reading and writing operation, and which carries out refresh operation at intervals of a predetermined time for rewriting data stored in memory cells 22 each of which is composed of a dynamic type memory cell. A timing generator 10 receives thereinto the row address strobing and the column address strobing so as to control column decoders 12, and also controls switching transistors 18 through control lines TG0 and TG1. Each of the column decoders 12 is a circuit adapted to select bit lines (data lines) of the memory cells 22 which are indicated by address signals $A_0$ to $A_n$. The switching transistors 18 connect sense amplifiers 14 and memory cells 22 with each other through the control lines TG0, TG1, and are connected to nodes SA and $\overline{SA}$ of the sense amplifiers 14. Each of the sense amplifiers 14 amplifies an information in a memory cell 22 that is designated through the data lines, and then transmits the information to an output buffer 16, and can rewrite the information in the memory cell 22 with a high degree of sensitivity and a high speed. The buffer 16 transmits the digital information received by the sense amplifier to an external apparatus (which is not shown). The row decoders 20 selectively drive the word lines indicated by the address signals $A_0$ to $A_n$, and accesses the memory cells 22. A switching transistor 24 connects a bit line voltage source VBL and the memory cells 22 with each other in accordance with control signals from a control line PR0 and a control line PR1. Each of the switching transistors 18, 24 is composed of a plurality of transistors serving as switches, which are controlled in accordance with a predetermined signal, independently from each other.

Figure 2:
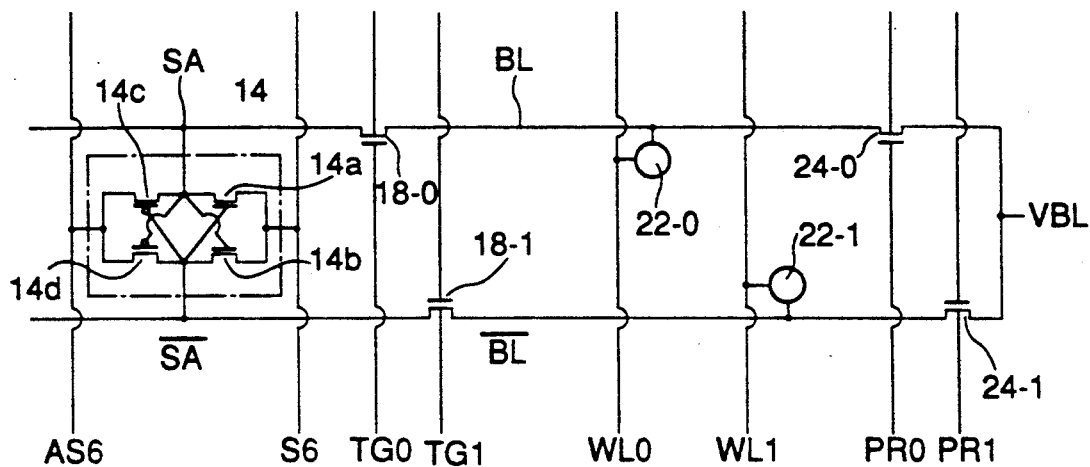
FIG. 2 is an example of the arrangement of a part of a sense amplifier in the embodiment shown in FIG. 1.

FIG. 2 is a detailed view illustrating a part of the circuit in the functional block shown in FIG. 1, which relates directly to the present invention. It is noted here that this circuit diagram shows a circuit arrangement having two dynamic type memory cells, for the sake of brevity in explanation. However, in a practical semiconductor memory circuit, several memory cells in a number corresponding to the capacity of the memory are arranged two-dimensionally so as to constitute dynamic RAM.

In this semiconductor memory circuit, a pair of bit lines BL, $\overline{BL}$ and two word lines WL0, WL1 are arranged crossing each other, and dynamic type memory cells 22-0, 22-1 each composed of a MOS transistor are connected thereto at the cross points thereof. The bit line BL is connected thereto with a sense amplifier node SA of an NMOS 18-0 adapted to be turned on and off in response to a control signal from the control line TG0 connected to a gate, through a drain source. Similarly, the bit line $\overline{BL}$ is connected to the sense amplifier node $\overline{SA}$ of an NMOS 18-1 adapted to be turned on and off in response to a control signal from the control line TG1 connected to a gate, through a drain source.

A sense amplifier 14 adapted to be activated by activating nodes S6, AS6, for sensing and amplifying a potential between a pair of bit lines is connected between the sense amplifier nodes SA, $\overline{SA}$. This sense amplifier 14 has NMOSs 14a, 14b and PMOSs 14c, 14d. The sources of the NMOSs 14a, 14b are connected commonly to the activating node S6, and the drains thereof are connected to sense amplifier nodes SA, $\overline{SA}$, respectively. The PMOSs 14c, 14d are connected at their sources commonly to the activating node AS6, and are connected at their drains to the sense amplifier nodes SA, $\overline{SA}$, respectively. The gates of the NMOS 14a, and the PMOS 14c are connected commonly to the sense amplifier node $\overline{SA}$, and further, the gates of the NMOS 14b and the PMOS 14d are connected commonly to the sense amplifier node SA.

Further, the pair of bit lines BL, $\overline{BL}$ are applied thereto with a bit line set voltage VBL from a bit line voltage source (that is, a precharge power source) by way of switching transistors such as NMOSs 24-0, 24-1 or the like. The NMOS 24-0 serving as a switch is applied at its gate with a control signal PR0, and is connected its source to the bit line BL while being applied at its drain with the bit line voltage VBL. Further, the NMOS 24-1 is applied at its gate with a control signal PR1, and is connected at its source with the bit line $\overline{BL}$ while being applied at its drain with the bit line set voltage VBL.

Figure 3:
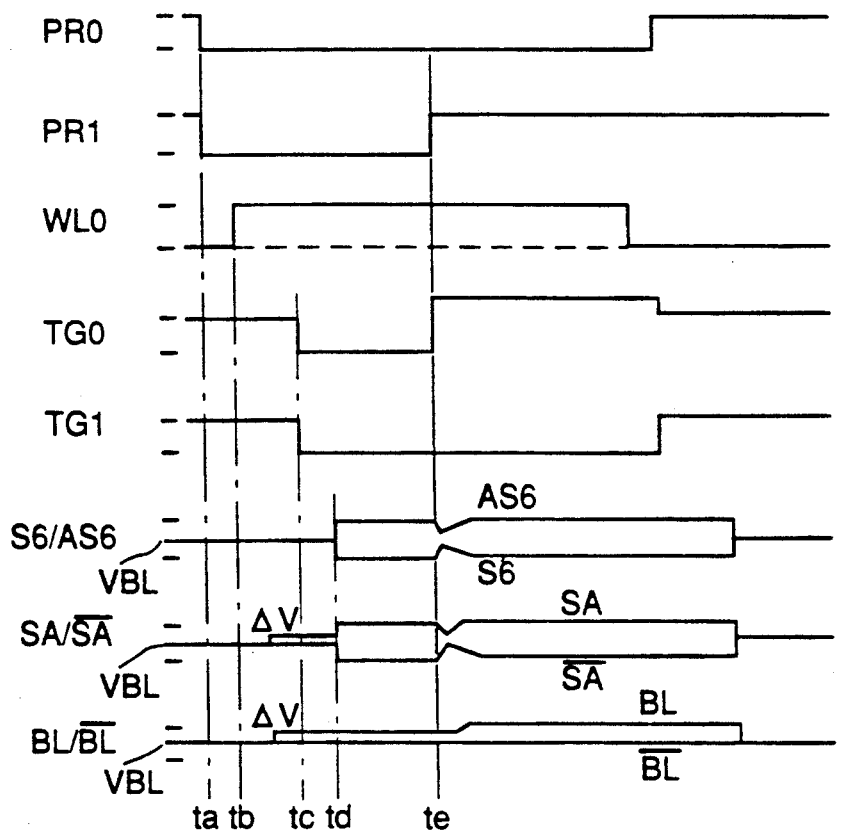
FIG. 3 is a view illustrating waveforms which indicate the operation of the example shown in FIG. 2.

Referring to FIG. 3 which is a view illustrating operating waveforms obtained from the arrangement shown in FIG. 1, explanation will be made of the operation of the arrangement shown in FIG. 2. Incidentally, a part indicated by the chain line in FIG. 3, gives a potential condition of the word line WL0 during non selected mode.

For example, it is estimated that a data "H" is stored in the memory cell 22-0. Explanation will be hereinbelow made of the reading operation of this memory cell 22-0.

Before the time ta in FIG. 3, when the control signals PR0 and PR1 exhibit "H", the NMOS 24-0, 24-1 are turned on, and accordingly, the sense amplifier nodes SA, $\overline{SA}$ and the bit lines BL, $\overline{BL}$ are precharged up to the bit line voltage VBL.

At the time ta, if the control signals PR0, PR1 are turned into "L" from "H", the NMOS 24-0, 24-1 are turned off, and accordingly, the bit lines BL, $\overline{BL}$ and the sense amplifier nodes SA, $\overline{SA}$ are left at the bit line voltage source VBL.

It is estimated that the word line WL0 is selected so that it is raised up to a boost level at the time tb. At this time, the word line WL1 is not selected so as to maintain "L". Due to raising the word line WL0, the memory cell 22-0 is selected, and the data "H" is transmitted from the memory cell 22-0 onto the bit line BL and the sense amplifier node SA. For example, a potential $\Delta V$ which is determined by the sum of a charge in the memory cell and a bit line charge value is produced between the pair of bit lines BL, $\overline{BL}$. One bit line $\overline{BL}$ and the sense amplifier node $\overline{SA}$ are maintained at the bit line voltage VBL if a parasitic capacity between itself and a signal line is neglected.

At the time tc, the control signals TG0, TG1 are lowered from "H" to "L". Then, the NMOSs 18-0, 18-1 are turned off, and accordingly, the sense amplifier node SA and the bit line BL, and the sense amplifier node $\overline{SA}$ and the bit line $\overline{BL}$ are separated from each other, respectively.

Next, in order to initiate the sense amplifying operation, at the time td, the activating nodes S6/AS6 are changed into "L"/"H", respectively, from the level of the bit line set voltage VBL. The activating nodes S6, AS6 are nodes which are common to the other sense amplifier (which is not shown), but the parasitic capacity of the sense amplifier nodes SA, $\overline{SA}$ is extremely smaller than that of bit lines BL, $\overline{BL}$. Thus, the levels of the activating lines S6/AS6 and the sense amplifier nodes SA/$\overline{SA}$ connected thereto are rapidly amplified so as to reach "H"/"L". At this time, the bit lines BL/$\overline{BL}$ sustain the following values, respectively BL:VBL+Dv,$\overline{BL}$:VBL.

Thereafter, in order to hold the impedance of the bit line set voltage VBL on the bit line $\overline{BL}$ at a low value, at the time te, the control signal PR1 is set to "H" from "L" so as to turn on the NMOS 24-1, and the bit line $\overline{BL}$ is applied with the bit line set voltage VBL. Simultaneously, at the time te, the control signal TG0 is raised to the boost level from "L". Then, the NMOS 18-0 is turned on, and accordingly, one bit line BL is connected to the sense amplifier node SA so that this bit line BL is charged through the sense amplifier node SA. The other bit line $\overline{BL}$ sustains the bit line set voltage VBL since the control signal TG1 sustains "L".

The activating nodes S6, AS6 are nodes, as mentioned above, common to the other sense amplifier. Accordingly, since "L"/"H" exist due to the information from the other bit line, it acts to pull the levels of the activating nodes S6/AS6 and the sense amplifier nodes SA/$\overline{SA}$ to the bit line set voltage VBL, as shown in FIG. 3. By the way, since the NMOS 18-1 which is turned off separates the bit lines $\overline{BL}$ from the sense amplifier node $\overline{SA}$, the charge value is about one-half so that the return with an extremely small value in comparison with the prior art can be realized. Accordingly, the levels of the activating nodes S6/AS6 and the sense amplifier nodes are rapidly returned to the ground level and the power source level. With this operation, the level of the bit line BL becomes that of the rewriting, and the rewriting of the read memory cell 22-0 is completed.

It is noted that the data amplified and read out by the sense amplifier 14 is transmitted to a data bus by way of a MOS transistor and the like (which are not shown) connected to the sense amplifier nodes SA, $\overline{SA}$.

The reading operation of the memory cell 22-0 for "H" has been explained hereinabove. The reading operation of the memory cell 22-0 for "L" is made by a process similar to that mentioned above.

In this embodiment, the following advantages can be obtained:

(a) Since the NMOS 18-1 is turned off by the control signal TG1 having "L" at the time te shown in FIG. 3, the rewriting of the non-selected one of the bit lines BL/$\overline{BL}$, for example, the bit line $\overline{BL}$, is inhibited while the NMOS 24-1 being turned on by the control signal PR1 having "H" so as to hold or fix the bit line $\overline{BL}$ at the level of the bit line set voltage VBL. Accordingly, it is possible to aim at enhancing the speed of the amplifying operation of the sense amplifier 14, and further, it is possible to reduce the charge and discharge current of the pair of bit lines BL/$\overline{BL}$ since no charge and discharge through the bit line BL are carried out. Further, the level of the bit line $\overline{BL}$ becomes a fixed potential with respect to the adjacent bit line, and accordingly, it is possible to eliminate the influence of the adjacent bit line which possibly occurs during the amplifying operation of the sense amplifier 14. Thus, it is possible to aim at enhancing the performance of the sense amplifier 14.

(b) In the above-mentioned embodiment, the reading operation has been explained. During the writing operation, the rewriting can be made for only one of the bit lines BL, $\overline{BL}$ on which the writing can be desired, similar to the above-mentioned embodiment. Moreover, the recharge and redischarge up to the precharge potential of a bit line on which the writing is not made, that is, up to the bit line set voltage VBL, are not required, and accordingly, it is possible to remarkably reduce the consumption current.

The present invention should not be limited to the above-mentioned embodiment, but various changes and modifications can be made thereto. That is, the following variant forms can be offered:

(i) In FIG. 2, the NMOSs 18-0, 18-1 alone are provided as switching transistors, that is, the other NMOSs 24-0, 24-1 can be eliminated. Further, the NMOSs 24-0, 24-1 alone are provided, that is, the other NMOS 18-0, 18-1 can be eliminated. Although the advantage obtained by this arrangement is more or less inferior to that obtained by the arrangement in which both kinds of NMOSs 18-0, 18-1, 24-0, 24-1 are provided, it is possible to expect that the amplifying operation can be made at a high speed while the charge and discharge current can be reduced, and that the influence of the adjacent bit line which occurs during the amplifying operation can be reduced.

Further, it is possible to use transistors other than those shown in FIG. 1, as the NMOSs 18-0, 18-1, 24-0, 24-1 serving as switches.

(ii) The sense amplifier 14 can be composed of transistors other than those shown in FIG. 2, or a circuit arrangement other than that shown FIG. 2 can be used.

(iii) Although FIG. 2 shows such a circuit arrangement that two memory cells 22-0, 22-1 are used, the number of memory cells and the numbers of the bit lines BL, $\overline{BL}$, the word lines WL0, WL1, and the like can be set optionally.

As mentioned above in detail, according to the first and fifth aspects of the present invention, since the rewriting of the non-selected one of the bit lines is restrained so as to restrain variations in the level of the non-selected bit line, it is possible to aim at enhancing the speed of the amplifying operation, and it is possible to reduce the charge and discharge current on the non-selected bit line. Moreover, since variations in the level of the non-selected bit line can be reduced, it is possible to enhance the performance of the sense amplifier.

According to the ninth aspect of the present invention, since four switching means are provided so as to inhibit the rewriting of the non-selected one of the bit lines and the level of the non-selected bit line is maintained or fixed, it is possible to further enhancing the speed of the amplifying operation of the sense amplifier, and it is possible to reduce the charge and discharge current on the non-selected bit line. Further, the level of the non-selected bit line becomes a fixed potential with respect to the adjacent bit line, it is possible to remarkably reduce the influence of the adjacent bit which possibly occurs during the amplifying operation of the sense amplifier, thereby it is possible to enhance the performance of the sense amplifier.

What we claim is:

1. A semiconductor memory circuit in which data are stored in a plurality of dynamic type memory cells located at cross-points of bit and word lines, and said memory cells are refreshed within a predetermined time by a sense amplifier so as to hold the thus stored data; comprising:
   a first bit line connected to a first sense node of said sense amplifier;
   a second bit line connected to a second sense node of said sense amplifier;
   a first switching circuit having a first terminal, disposed between said first bit line and said first sense node, for coupling said first bit line with said first sense node in response to a first control signal applied to the first terminal;
   a second switching circuit having a second terminal, disposed between said second bit line and said second sense node, for coupling said second bit line with said second sense node in response to a second control signal applied to the second terminal;
   a first control line coupled to the first terminal and isolated from the second switching circuit and the second bit line, for providing the first control signal; and
   a second control line coupled to the second terminal and isolated from the first switching circuit and the first bit line, for providing the second control signal.

2. A semiconductor memory circuit as set forth in claim 1, wherein when said first bit line is not selected upon rewriting, said first switching circuit is not communicated with its associated sense node while when said second bit line is not selected, said second switching circuit is not communicated with its associated sense node.

3. A semiconductor memory circuit as set forth in claim 1, wherein said first and second switching circuits each comprise a respective MOS transistor having n channels.

4. A semiconductor memory circuit as set forth in claim 1, wherein said sense amplifier has first and second transistors each of which is a MOS transistor having n channels, and third and fourth transistors each of which is a MOS transistor having p channels; and wherein drains of said first and third transistors are connected to said first sense node, and drains of said second and fourth transistors are connected to said second sense node.

5. A semiconductor memory circuit in which data are stored in a plurality of dynamic type memory cells located at cross points of bit and word lines, and said memory cells are refreshed by a sense amplifier within a predetermined time so as to hold the data stored in said memory cells, comprising:
   a first bit line connected to a first sense node of said sense amplifier;
   a second bit line connected to a second sense node of said sense amplifier;
   a bit line voltage source for precharging said first and second bit lines up to a predetermined voltage;
   a first switching circuit having a first terminal, disposed between said first bit line and said bit line voltage source, for coupling said first bit line with said bit line voltage source in response to a first control signal applied to the first terminal;
   a second switching circuit having a second terminal, disposed between said second bit line and said bit line voltage source, for coupling said second bit line with said bit line voltage source in response to a second control signal applied to the second terminal;
   a first control line coupled to the first terminal and isolated from the second switching circuit and the second bit line, for providing the first control signal; and
   a second control line coupled to the second terminal and isolated from the first switching circuit and the first bit line, for providing the second control signal.

6. A semiconductor memory circuit as set forth in claim 5, wherein when said first bit line is not selected upon rewriting, said first switching circuit is not communicated with its associated sense node while when said second bit line is not selected, said second switching circuit is not communicated with its associated sense node.

7. A semiconductor memory circuit as set forth in claim 5, wherein said first and second switching circuits each comprise a respective MOS transistor having n channels.

8. A semiconductor memory circuit as set forth in claim 5, wherein said sense amplifier has first and second transistors each of which is a MOS transistor having n channels, and third and fourth transistors each of which is a MOS transistor having p channels; and wherein drains of said first and third transistors are connected to said first sense node, and drains of said second and fourth transistors are connected to said second sense node.

9. A semiconductor memory circuit in which data are stored in a plurality dynamic type memory cells located at cross points between bit and word lines, and said memory cells are refreshed within a predetermined time by a sense amplifier so as to hold said stored data, comprising:

a first bit line connected to a first sense node of said sense amplifier;

a second bit line connected to a second sense node of said sense amplifier;

a bit line voltage source for precharging said first and second bit line up to a predetermined voltage;

a first switching circuit having a first terminal, disposed between said first bit line and said first sense node, for coupling said first bit line with said first sense node in response to a first control signal applied to the first terminal;

a second switching circuit having a second terminal, disposed between said second bit line and said second sense node, for coupling said second bit line with said second sense node in response to a second control signal applied to the second terminal;

a third switching circuit having a third terminal, disposed between said first bit line and said bit line voltage source, for coupling said first bit line with said bit line voltage source in response to a third control signal applied to the third terminal;

a fourth switching circuit having a fourth terminal, disposed between said second bit line and said bit line voltage source, for coupling said second bit line with said second bit line voltage source in response to a fourth control signal applied to the fourth terminal; and a first control line coupled to the first terminal and isolated from the second switching circuit, the fourth switching circuit and the second bit line, for providing the first control signal;

a second control line coupled to the second terminal and isolated from the first switching circuit, the third switching circuit and the first bit line, for providing the second control signal;

a third control line coupled to the third terminal and isolated from the second switching circuit, the fourth switching circuit and the second bit line, for providing the third control signal;

a fourth control line coupled to the fourth terminal and isolated from the first switching circuit, the third switching circuit and the first bit line, for providing the fourth control signal.

10. A semiconductor memory circuit as set forth in claim 9, wherein when either one of said first bit line and said second bit line is not selected upon rewriting, rewriting of the not selected bit line is inhibited, and the level of said not selected bit line is maintained or fixed.

11. A semiconductor memory circuit comprising:
a first and a second node;
a first and a second memory cell each storing data;
a first bit line coupled to the first memory cell and the first node,
a second bit line coupled to the second memory cell and the second node;
a sense amplifier having a first and a second sense node, for amplifying a difference voltage level between the first and second bit lines;
a first transistor having a first control electrode, for coupling the first node with the first sense node in response to a first control signal;
a second transistor having a second control electrode, for coupling the second node with the second sense node in response to a second control signal;
a first control line coupled to the first control electrode and isolated from the second transistor and the second bit line, for providing the first control signal; and
a second control line coupled to the second control electrode and isolated from the first transistor and the second bit line, for providing the second control signal.

12. The semiconductor memory circuit according to claim 11, further comprising:
a third node;
a source supply for supplying a potential to the third node;
a third transistor having a third control electrode, for coupling the first bit line with the third node in response to a third control signal;
a fourth transistor having a fourth control electrode, for coupling the second bit line with the third node in response to a fourth control signal;
a third control line coupled to the third control electrode and isolated from the fourth transistor and the second bit line, for providing the third control signal; and
a fourth control line coupled to the fourth control electrode and isolated from the third transistor and the first bit line, for providing the fourth control signal.

13. The semiconductor memory circuit according to claim 11, wherein when the first signal is applied to the first control electrode, the second transistor electrically disconnects the second sense node from the second node.

14. The semiconductor memory circuit according to claim 12, wherein when the first signal is applied to the first control electrode and the third signal is applied to the third control electrode, the second transistor electrically disconnects the second sense node from the second node and the fourth transistor disconnects the second bit line from the third bit line.

15. A semiconductor memory circuit comprising:
a first, a second, and a third node;
a source supply for supplying a potential to the first node;
a first bit line coupled to the second node;
a second bit line coupled to the third node;
a sense amplifier having a first and a second sense node, for amplifying a difference voltage level between the first and second bit lines, the first sense node being coupled to the first bit line, the second sense node being coupled to the second bit line;
a first transistor having a first control electrode, for coupling the first node with the second node in response to a first control signal;
a second transistor having a second control electrode, for coupling the first node with the third node in response to a second control signal;
a first control line coupled to the first control electrode and isolated from the second transistor and the second bit line, for providing the first control signal; and
a second control line coupled to the second control electrode and isolated from the first transistor and the first bit line, for providing the second control signal.

16. The semiconductor memory circuit according to claim 15, wherein when the first signal is applied to the first transistor, the second transistor electrically disconnects the third node from the first node.

17. The semiconductor memory circuit according to claim 15, further comprising:
- a third transistor having a third control electrode, for coupling the first bit line with the first sense node in response to a third control signal;
- a fourth transistor having a fourth control electrode, for coupling the second bit line with the second sense node in response to a fourth control signal;
- a third control line coupled to the third control electrode and isolated from the fourth transistor and the second bit line, for providing the third control signal; and
- a fourth control line coupled to the fourth control electrode and isolated from the third transistor and the first bit line, for providing the fourth control signal.

18. The semiconductor memory circuit according to claim 17, wherein when the first signal is applied to the first control electrode and the third signal is applied to the third control electrode, the second transistor electrically disconnects the third node from the second node and the fourth transistor disconnects the second bit line from the second sense node.

* * * * *